(12) United States Patent
Lin et al.

(10) Patent No.: US 9,076,870 B2
(45) Date of Patent: Jul. 7, 2015

(54) METHOD FOR FORMING FIN-SHAPED STRUCTURE

(71) Applicant: UNITED MICROELECTRONICS CORP., Hsin-Chu (TW)

(72) Inventors: Chien-Ting Lin, Hsinchu (TW); Shih-Hung Tsai, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 161 days.

(21) Appl. No.: 13/772,343

(22) Filed: Feb. 21, 2013

(65) Prior Publication Data

US 2014/0235043 A1 Aug. 21, 2014

(51) Int. Cl.
*H01L 21/28* (2006.01)
*H01L 29/78* (2006.01)
*H01L 29/66* (2006.01)

(52) U.S. Cl.
CPC ...... *H01L 29/7853* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,855,607 B2 | 2/2005 | Achuthan | |
| 6,921,963 B2 | 7/2005 | Krivokapic | |
| 7,013,446 B2 | 3/2006 | Ohba | |
| 7,087,477 B2 | 8/2006 | Fried | |
| 7,091,551 B1 | 8/2006 | Anderson | |
| 7,112,495 B2 | 9/2006 | Ko | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,521,324 B2 | 4/2009 | Ohmi | |
| 7,531,437 B2 | 5/2009 | Brask | |
| 7,569,857 B2 | 8/2009 | Simon | |
| 7,592,270 B2 | 9/2009 | Teo | |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0001173 A1 | 1/2007 | Brask | |
| 2007/0015365 A1 | 1/2007 | Chen | |
| 2007/0072376 A1 | 3/2007 | Chen | |
| 2007/0108528 A1 | 5/2007 | Anderson | |
| 2007/0158756 A1 | 7/2007 | Dreeskornfeld | |
| 2007/0218661 A1 | 9/2007 | Shroff | |
| 2008/0061366 A1 | 3/2008 | Liu | |
| 2008/0157208 A1 | 7/2008 | Fischer | |
| 2009/0057759 A1 | 3/2009 | Obradovic | |
| 2009/0124097 A1 | 5/2009 | Cheng | |
| 2009/0200494 A1 | 8/2009 | Hatem | |
| 2009/0242964 A1 | 10/2009 | Akil | |
| 2009/0269916 A1 | 10/2009 | Kang | |
| 2009/0294840 A1* | 12/2009 | Gilgen et al. | 257/327 |

(Continued)

*Primary Examiner* — Alexander Ghyka
(74) *Attorney, Agent, or Firm* — Winston Hsu; Scott Margo

(57) ABSTRACT

A method for forming a fin-shaped structure includes the following steps. A pad layer is formed on a substrate. A sacrificial pattern is formed on the pad layer. A spacer is formed on the pad layer beside the sacrificial pattern, wherein the ratio of the height of the spacer to the pad layer is larger than 5. The sacrificial pattern is removed. The layout of the spacer is transferred to the substrate to form at least a fin-shaped structure having a taper profile in the substrate.

17 Claims, 5 Drawing Sheets

(56) References Cited

U.S. PATENT DOCUMENTS

| | | |
|---|---|---|
| 2010/0044783 A1 | 2/2010 | Chuang |
| 2010/0048027 A1 | 2/2010 | Cheng |
| 2010/0066440 A1* | 3/2010 | Juengling .................... 327/537 |
| 2010/0072553 A1 | 3/2010 | Xu |
| 2010/0129994 A1 | 5/2010 | Awad |
| 2010/0144121 A1 | 6/2010 | Chang |
| 2010/0167506 A1 | 7/2010 | Lin |
| 2011/0068405 A1* | 3/2011 | Yuan et al. .................... 257/365 |

* cited by examiner

METHOD FOR FORMING FIN-SHAPED STRUCTURE

BACKGROUND OF THE INVENTION

1. Field of the Invention

The present invention relates generally to a method for forming a fin-shaped structure, and more specifically to a method for forming a fin-shaped structure having a taper profile.

2. Description of the Prior Art

With the increasing miniaturization of semiconductor devices, various multi-gate MOSFET devices have been developed. The multi-gate MOSFETs are advantageous for the following reasons. First, the manufacturing processes of the multi-gate MOSFET devices can be integrated into traditional logic device processes, and thus are more compatible. In addition, since the three-dimensional structure of a multi-gate MOSFET increases the overlapping area between the gate and the substrate, its channel region is controlled more effectively. This therefore reduces drain-induced barrier lowering (DIBL) effect and short channel effect. Moreover, the channel region is longer for a similar gate length. Therefore, the current between the source and the drain is increased.

However, as the size of the multi-gate MOSFETs shrink, the electrical and physical requirements in each parts of the multi-gate MOSFET become critical, like the sizes and shapes of the fin-shaped structures and the spacings between each fin-shaped structures for example. Thus, how to reach standard requirements and overcome these physical limitations has become an important issue in the industry of the multi-gate MOSFETs.

SUMMARY OF THE INVENTION

The present invention provides a method for forming a fin-shaped structure wherein the fin-shaped structure has a taper profile in order to improve the processing qualities and to simplify the process.

The present invention provides a method for forming a fin-shaped structure including the following steps. A pad layer is formed on a substrate. A sacrificial pattern is formed on the pad layer. A spacer is formed on the pad layer beside the sacrificial pattern, wherein the ratio of the height of the spacer to that of the pad layer is larger than 5. The sacrificial pattern is then removed. The layout of the spacer is further transferred into the substrate to form at least a fin-shaped structure having a taper profile in the substrate.

According to the above, the present invention provides a method for forming a fin-shaped structure, which forms at least a fin-shaped structure having a taper profile in a substrate by transferring the layout of spacers into the substrate. It is emphasized that, the height ratio of the spacer to the pad layer in the present invention is larger than 5, so the fin-shaped structure of the present invention can be formed. For example, the fin-shaped structure formed through this method has a taper profile. Preferably, the maximum width of the fin-shaped structure is in a range of 5~20 nanometers, and the pitch between each of the fin-shaped structures can approach 70 nanometers.

These and other objectives of the present invention will no doubt become obvious to those of ordinary skill in the art after reading the following detailed description of the preferred embodiment that is illustrated in the various figures and drawings.

DETAILED DESCRIPTION

A semiconductor chip may include a plurality of electrical circuit areas, such as core electrical circuit areas, logical electrical circuit areas, input/output electrical circuit areas, static random access memory (SRAM) electrical circuit areas etc. Planar transistors or/and non-planar transistors with different electrical types may be needed to be formed in each area, and the selection and integration of planar transistors or/and non-planar transistors depend upon the needed functions. Structures of planar transistors and non-planar transistors are illustrated in the following.

Figure 1:
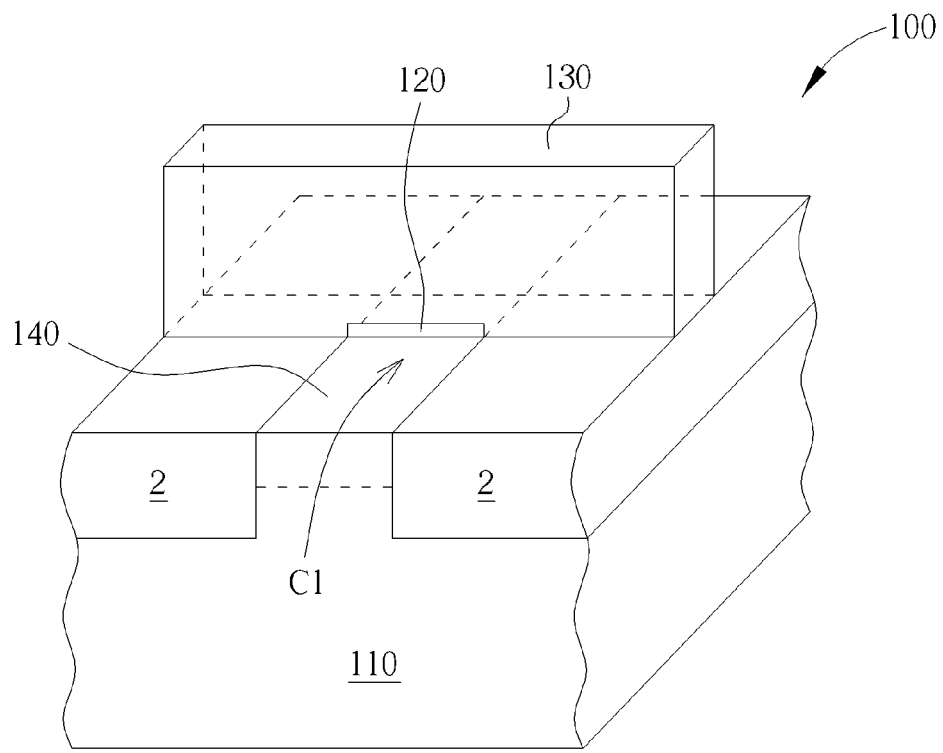
FIG. 1 schematically depicts a three-dimensional diagram of a planar transistor according to a first embodiment of the present invention.

FIG. 1 schematically depicts a three-dimensional diagram of a planar transistor according to a first embodiment of the present invention. As shown in FIG. 1, a planar transistor 100 includes a substrate 110, at least an isolation structure 2, a gate dielectric layer 120, an electrode 130 and a source/drain region 140. The substrate 110 may be a semiconductor substrate such as a silicon substrate, a silicon containing substrate such as a silicon carbide substrate, a III-V group-on-silicon (such as GaN-on-silicon) substrate, a graphene-on-silicon substrate, a silicon-on-insulator (SOI) substrate or an epitaxial layer containing a substrate such as a P-type substrate with a 2.5 μm P-type epitaxial layer. The isolation structure 2 is located in the substrate 110, wherein the isolation structure 2 is used to isolate each transistor formed on the substrate 110. The isolation structure 2 may be a shallow trench isolation (STI) structure, which may be formed through a shallow trench isolation (STI) process; or, the isolation structure 2 may be a deep trench isolation (DTI) structure, which may be formed through a deep trench isolation (DTI) process, wherein the depth of the shallow trench isolation (STI) structure may be comprised within a range of 2500~4000 angstroms, and the depth of the deep trench isolation (DTI) structure may be comprised within a range of 25000~36000 angstroms, but it is not limited thereto, and the forming methods are known in the art so as not to describe herein.

The gate dielectric layer 120 is located between the substrate 110 and the electrode 130. The gate dielectric layer 120 may be an oxide layer ($SiO_2$), which may be formed through a thermal oxide process or a chemical oxide process, and has a "-"-shaped cross-sectional profile. The electrode 130 may be a word line crossing a plurality of transistors, and the material may be polysilicon, thereby constituting a polysilicon gate. The source/drain region 140 is located in the substrate 110 beside the electrode 130 and the gate dielectric layer 120, wherein the dopant of the source/drain region 140 depends upon the electrical type of the formed planar transistor 100. For instance, if the planar transistor 100 is an N-type transistor, the dopant of the source/drain region 140 may be pentavalent ions such as phosphorus; if the planar transistor 100 is a P-type transistor, the dopant of the source/drain region 140 may be trivalent ions, such as boron. Then, later semiconductor processes may be performed to electrically connect the electrode 130 and the source/drain region 140 outwards. Moreover, strained-silicon technology processes may be performed to induce strain on a semiconductor crystal thereby altering the speed at which charges move through that crystal. Strain makes MOS transistors work better by enabling electrical charges, such as electrons, to pass more easily through the silicon lattice of the gate channel.

Furthermore, the planar transistor 100 may include a spacer (not shown) located on the substrate 110 beside the electrode 130 and the gate dielectric layer 120. Therefore, a metal gate replacement process may be performed in later processes. When a gate last for high-k last process is applied, the metal gate replacement process is performed to remove the electrode 130 and the gate dielectric layer 120 surrounded by the spacer (not shown) sequentially, and then the gate dielectric layer 120 is replaced by other denser buffer layers and dielectric layers having a high dielectric constant while the electrode 130 is replaced by a metal electrode, so that a metal gate including a work function metal layer and a low resistivity material is formed, but it is not limited thereto. In another embodiment, the gate dielectric layer 120 may not be removed and may be used as a buffer layer, and a dielectric layer having a high dielectric constant is directly formed thereon. In addition, when a gate last for high-k first process is applied, the gate dielectric layer 120 already includes a gate dielectric layer having a high dielectric constant, so that a metal gate replacement process is performed to remove the electrode 130 only, and replaces it by a metal electrode, so that a metal gate including a work function metal layer and a low resistivity material is formed, but it is not limited thereto. Moreover, the gate dielectric layer 120 may further include a buffer layer (not shown) located between the substrate 110 and a dielectric layer having a high dielectric constant. In other ways, the planar transistor 100 may be a transistor having a polysilicon gate or may be formed through applying a gate first process or etc.

Whether the planar transistor 100 has a polysilicon gate or a metal gate, the gate channel C1 is located below the gate dielectric layer 120 and in the substrate 110 between the source/drain region 140, and therefore has a "—"-shaped cross-sectional profile.

However, with the increasing miniaturization of the semiconductor devices, various Fin-shaped field effect transistor (FinFET) devices have been developed. The Fin-shaped field effect transistor (FinFET) is advantageous for the following reasons. First, manufacturing processes of Fin-shaped field effect transistor (FinFET) devices can be integrated into traditional logic device processes, and thus are more compatible. In addition, since the three-dimensional structure of the FinFET increases the overlapping area between the gate and the substrate, the channel region is controlled more effectively. This therefore reduces drain-induced barrier lowering (DIBL) effects and short channel effects. Moreover, the channel region is longer for a similar gate length. Therefore, the current between the source and the drain is increased. Thus, multi-gate MOSFETs and processes thereof are presented in the following. Besides, different numbers of fin-shaped structures may be described in different steps of these embodiments to simplify and clarify the present invention, and common components are represented by common symbols, but the numbers of applied fin-shaped structures in each step are not restricted.

Figure 2:
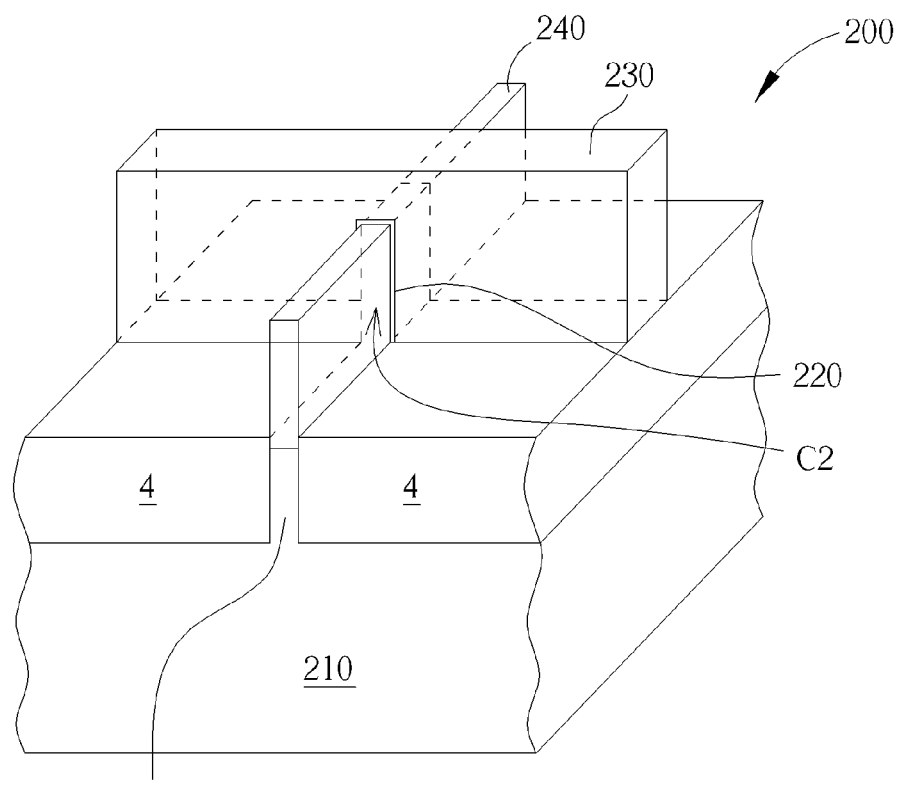
FIG. 2 schematically depicts a three-dimensional diagram of a multi-gate MOSFET according to a second embodiment of the present invention.

FIG. 2 schematically depicts a three-dimensional diagram of a multi-gate MOSFET according to a second embodiment of the present invention. In FIG. 2 one example of a multi-gate MOSFET—a tri-gate MOSFET—is shown. A tri-gate MOSFET 200 may include a substrate 210, a fin-shaped structure 212, at least an isolation structure 4, a gate dielectric layer 220, an electrode 230 and a source/drain region 240.

The fin-shaped structure 212 is located on the substrate 210. Generally, the fin-shaped structure 212 and the substrate 210 form one piece only, but the fin-shaped structure 212 may be additionally formed on the substrate 210, depending upon the needs. The substrate 210 may be a semiconductor substrate such as a silicon substrate, a silicon containing substrate such as a silicon carbide substrate, a III-V group-on-silicon (such as GaN-on-silicon) substrate, a graphene-on-silicon substrate, a silicon-on-insulator (SOI) substrate or an epitaxial layer containing substrate such as a P-type substrate with a 2.5 µm P-type epitaxial layer. Moreover, the substrate 210 may have desired crystalline surfaces for later semiconductor processes; for example, the etching direction of an etching process may depend on the crystalline surfaces to etch desired shapes of recesses or trenches. The isolation structure 4 is located on the substrate 210 beside the fin-shaped structure 212, wherein the isolation structure 4 is used to isolate each transistor formed on the substrate 210. The isolation structure 4 may be a shallow trench isolation (STI) structure, which may be formed through a shallow trench isolation (STI) process, or the isolation structure 4 may be a deep trench isolation (DTI) structure, which may be formed through a deep trench isolation (DTI) process, wherein the depth of the shallow trench isolation (STI) structure may be comprised within a range of 2500~4000 angstroms, and the depth of the deep trench isolation (DTI) structure may be comprised within a range of 25000~36000 angstroms, but not limited thereto, and the forming methods are known in the art so as not to describe herein.

The gate dielectric layer 220 covers a part of the fin-shaped structure 212, and is located between the fin-shaped structure 212 and the electrode 230. The gate dielectric layer 220 has a "⊓"-shaped cross-sectional profile. The gate dielectric layer 220 may be a silicon oxide, which may be formed through a thermal oxide process or a chemical oxide process, but it is not limited thereto. The electrode 230 is disposed across a plurality of transistors and may be a word line or etc. The material of the electrode 230 may be polysilicon, thereby forming a polysilicon gate.

The source/drain region 240 is located in the fin-shaped structure 212 beside the electrode 230 and the gate dielectric layer 220, wherein the dopants of the source/drain region 240 depend upon the electrical type of the formed tri-gate MOSFET 200. For instance, if the tri-gate MOSFET 200 is an N-type transistor, the dopants of the source/drain region 240 may be pentavalent ions such as phosphorus; and if the tri-gate MOSFET 200 is a P-type transistor, the dopants of the source/drain region 240 may be trivalent ions such as boron. Later semiconductor processes may be carried out to electrically connect the electrode 230 and the source/drain region 240. Moreover, strained-silicon technologies may be applied to induce strain on a semiconductor crystal, thereby altering the speed at which charges move through that crystal. Strain makes MOS transistors work better by enabling electrical charges, such as electrons, to pass more easily through the silicon lattice of the gate channel.

Furthermore, the tri-gate MOSFET 200 may include a spacer (not shown) located on the substrate 210 and the fin-shaped structure 212 beside the electrode 230 and the gate dielectric layer 220. Therefore, a metal gate replacement process may be performed in later processes. When a gate last for high-k last process is applied, the metal gate replacement process is performed to remove the electrode 230 and the gate dielectric layer 220 surrounded by the spacer (not shown) sequentially, and then the gate dielectric layer 220 is replaced by another denser buffer layer and dielectric layer having a high dielectric constant while the electrode 230 is replaced by a metal electrode, so that a metal gate including a work function metal layer and a low resistivity material is formed, but it is not limited thereto. In another embodiment, the gate dielectric layer 220 may not be removed and may be used as a buffer layer, and a dielectric layer having a high dielectric constant is directly formed thereon. In addition, when a gate last for high-k first process is applied, the gate dielectric layer 220 already includes a gate dielectric layer having a high dielectric constant, so a metal gate replacement process is performed to remove the electrode 230 only which is then replaced by a metal electrode, so that a metal gate including a work function metal layer and a low resistivity material is formed, but it is not limited thereto. Moreover, the gate dielectric layer 220 may further include a buffer layer (not shown) located between the substrate 210 and a dielectric layer having a high dielectric constant. In other ways, the tri-gate MOSFET 200 may be a transistor having a polysilicon gate, or may be formed by applying a gate first process or etc.

The tri-gate MOSFET 200 in this embodiment includes the gate dielectric layer 220 having a "⊓" shaped cross-sectional profile, and a gate channel C2 below therefore has a "⊓" shaped cross-sectional profile. In other words, the gate channel C2 of the tri-gate MOSFET 200 has a gate channel composed of three surfaces corresponding to the "⊓" shape. Compared to the gate channel C1 with only one surface (as shown in FIG. 1) of the planar transistor 100, the tri-gate MOSFET 200 has the advantages of smaller volume and faster carrier mobility.

Furthermore, a fin-shaped structure may have different shapes. For example, the fin-shaped structure may be a fin-shaped structure 212 having vertical sidewalls, or a fin-shaped structure having taper sidewalls etc, and different processes may be needed to form fin-shaped structures having different shapes. The process for forming the fin-shaped structure 212 having vertical sidewalls and taper sidewalls are sequentially described in the following.

Figure 3:
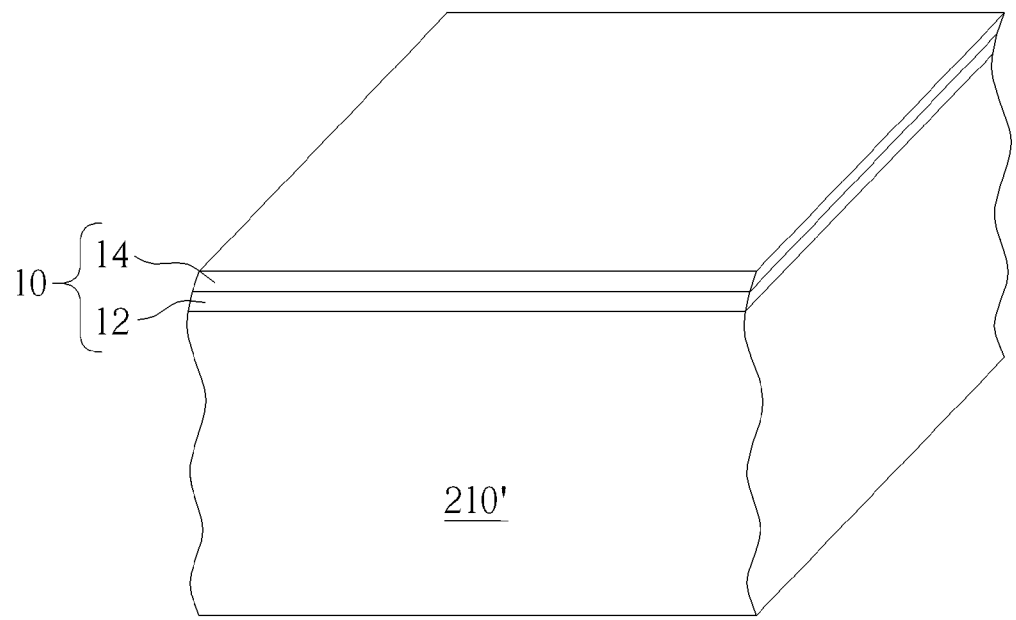
FIGS. 3-4 schematically depict cross-sectional views of a method for forming a fin-shaped structure according to the second embodiment of the present invention.
Figure 4:
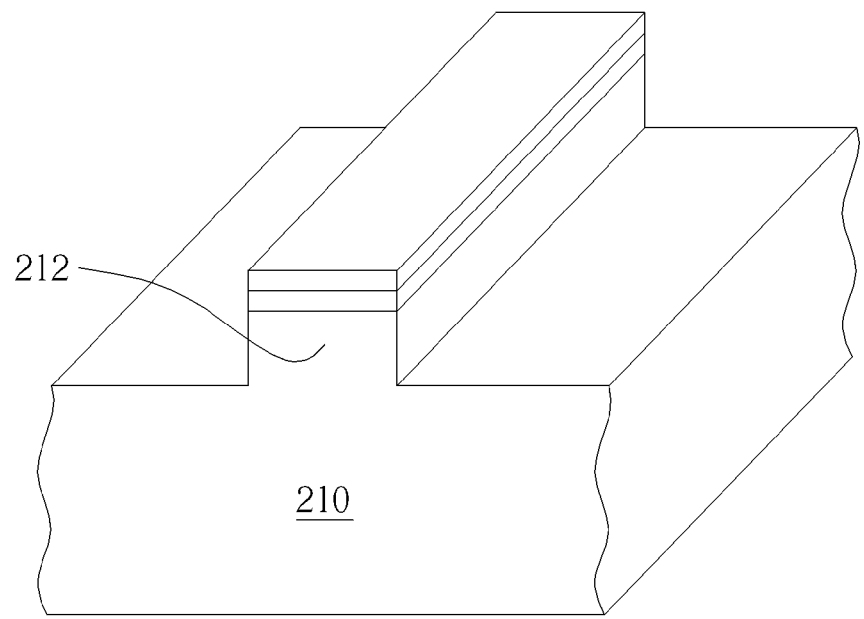

The method for forming the fin-shaped structure 212 having vertical sidewalls on the substrate 210 may include the following steps. FIGS. 3-4 schematically depict cross-sectional views of a method for forming a fin-shaped structure according to the second embodiment of the present invention.

As shown in FIG. 3, a bulk substrate 210' is provided, and a hard mask layer 10 is formed thereon, wherein the hard mask layer 10 may include a pad oxide layer 12 and a nitride layer 14. As shown in FIG. 4, the hard mask layer 10 is patterned to define the location for forming a fin-shaped structure in the bulk substrate 210'. An etching process is performed to form a fin-shaped structure 212 in the bulk substrate 210'. This means that the fabrication of forming the fin-shaped structure 212 on the substrate 210 is complete. In this embodiment, the hard mask layer 10 is removed in a later process after the fin-shaped structure 212 is formed, so that a tri-gate MOSFET can be formed in the following processes. There are three contact faces between the fin structure 212 and the following formed dielectric layer serving as a carrier channel of which width is wider than a channel width in conventional planar MOSFETs. When a driving voltage is applied, the tri-gate MOSFET produces an on-current twice higher than in conventional planar MOSFETs. In another embodiment, the hard mask layer 10 is reserved to form a fin field effect transistor (Fin FET), which is another kind of multi-gate MOSFET. Since the hard mask layer 10 is reserved in the fin field effect transistor, there are only two contact faces between the fin structure 212 and the following formed dielectric layer.

The present invention can also be applied to other semiconductor substrates. For example, a silicon-on-insulator substrate (not shown) is provided, and then a single crystalline silicon layer being a top part of the silicon-on-insulator substrate (not shown) is etched till an oxide layer being a middle part of the silicon-on-insulator substrate (not shown) is exposed, meaning that the fin-shaped structure formed on the silicon-on-insulator substrate (not shown) is finished.

In order to clarify the present invention, one single fin-shaped structure 212 is depicted in this embodiment, but the present invention can also be applied to a plurality of fin-shaped structures 212.

According to the above, the fin-shaped structure 212 formed through aforesaid method has vertical sidewalls and the width of the fin-shaped structure 212 and the pitch between each of the fin-shaped structure 212 are hard to narrow due to the process limitations. One embodiment of the present invention for forming a fin-shaped structure having a taper profile is presented in the following, wherein the maximum width of the formed fin-shaped structure can approach 20 nanometers, and the pitch of each of the fin-shaped structures can approach 70 nanometers. Therefore, the devices formed by the fin-shaped structures of this embodiment can have better electrical performances and smaller sizes than in the previous embodiment.

Figure 5:
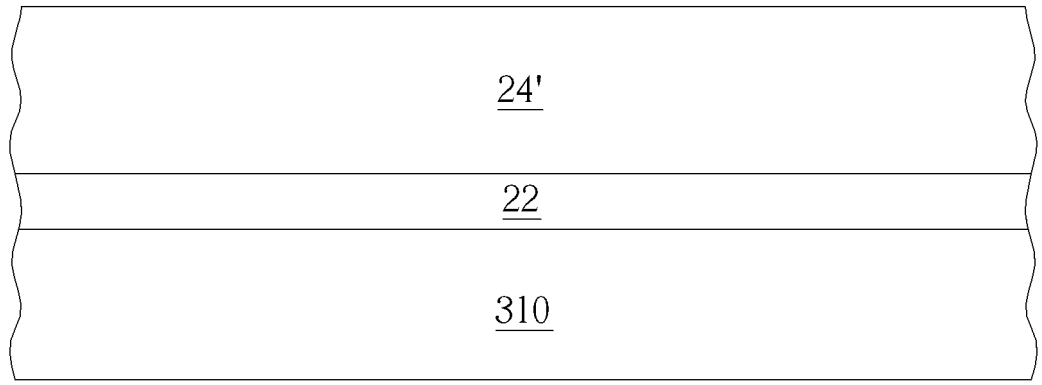
FIGS. 5-10 schematically depict cross-sectional views of a method for forming a fin-shaped structure according to a third embodiment of the present invention.
Figure 6:
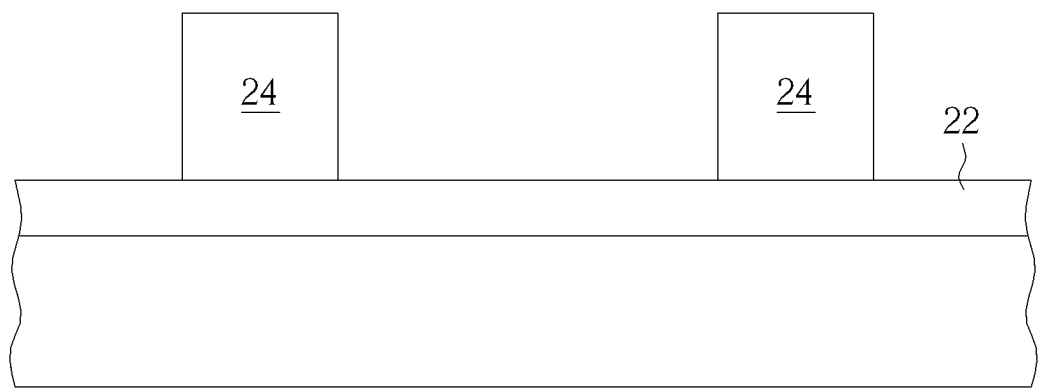

FIGS. 5-10 schematically depict cross-sectional views of a method for forming a fin-shaped structure according to a third embodiment of the present invention. As shown in FIG. 5, a substrate 310 is provided, wherein the substrate 310 may be a semiconductor substrate such as a silicon substrate, a silicon containing substrate such as a silicon carbide substrate, a III-V group-on-silicon (such as GaN-on-silicon) substrate, a graphene-on-silicon substrate, a silicon-on-insulator (SOI) substrate or an epitaxial layer containing substrate such as a P-type substrate with a 2.5 μm P-type epitaxial layer. A pad layer 22 is formed on the substrate 310, wherein the pad layer 22 may include an oxide layer, but it is not limited thereto. A sacrificial pattern material 24' is formed to entirely cover the pad layer 22. As shown in FIG. 6, the sacrificial pattern material 24' is patterned to form a sacrificial pattern 24. In this embodiment, the sacrificial pattern material 24' is polysilicon, and the sacrificial pattern 24 is therefore a polysilicon gate, so that the forming method can be similar to the current process of a polysilicon gate, but it is not limited thereto.

Figure 7:
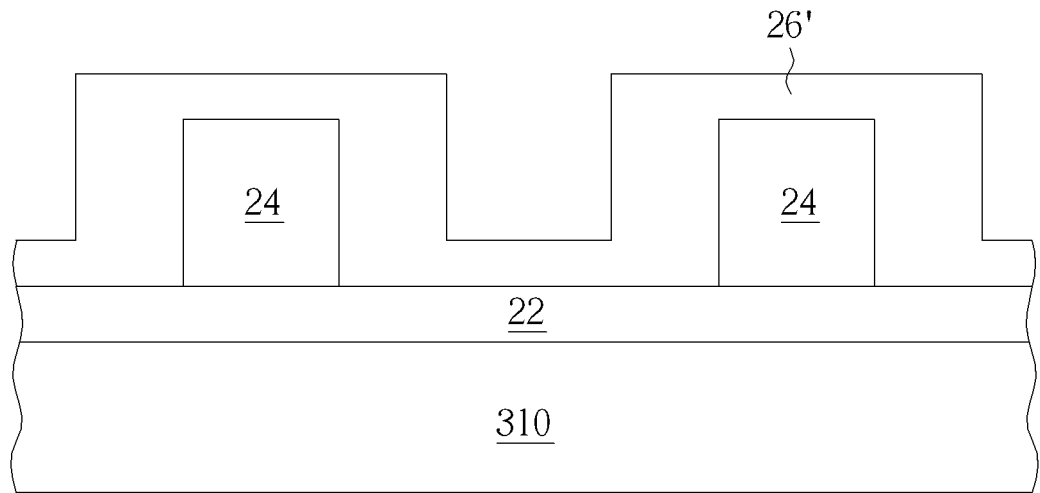
Figure 8:
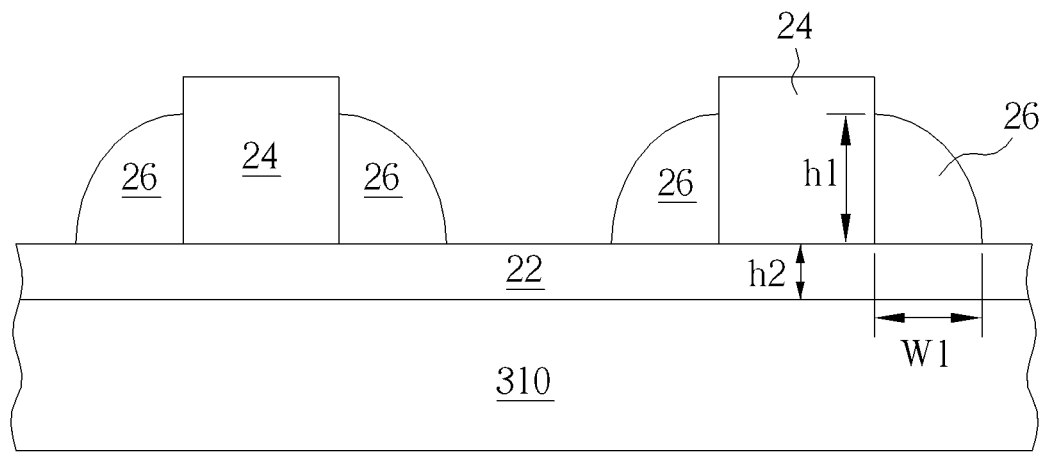

As shown in FIGS. 7-8, a spacer 26 is formed on the pad layer 22 beside the sacrificial pattern 24. More precisely, as shown in FIG. 7, a spacer material 26' entirely covers the sacrificial pattern 24 and the pad layer 22. Then, the spacer material 26' is etched to form spacers 26 on the pad layer 22 beside the sacrificial pattern 24. The spacer material 26' may be silicon nitride, so the spacer 26 is therefore a nitride spacer, but it is not limited thereto.

It is emphasized that, the ratio of the height h1 of the spacer 26 to the thickness h2 of the pad layer 22 is larger than 5, so that a fin-shaped structure can be formed in the substrate 310 in later processes. In this embodiment, as the pad layer 22 is an oxide layer and the spacer 26 is a nitride spacer, the thickness of the pad layer 22 is preferred to be substantially 100~110 angstroms while the thickness of the spacer 26 is preferred to be substantially 800~900 angstroms, but it is not limited thereto. The relative height h1 and thickness h2 of the pad layer 22 and the spacer 26 and the materials of the pad layer 22 and the spacer 26 depend upon the height, the width and the pitch of the desired formed fin-shaped structures.

Figure 9:
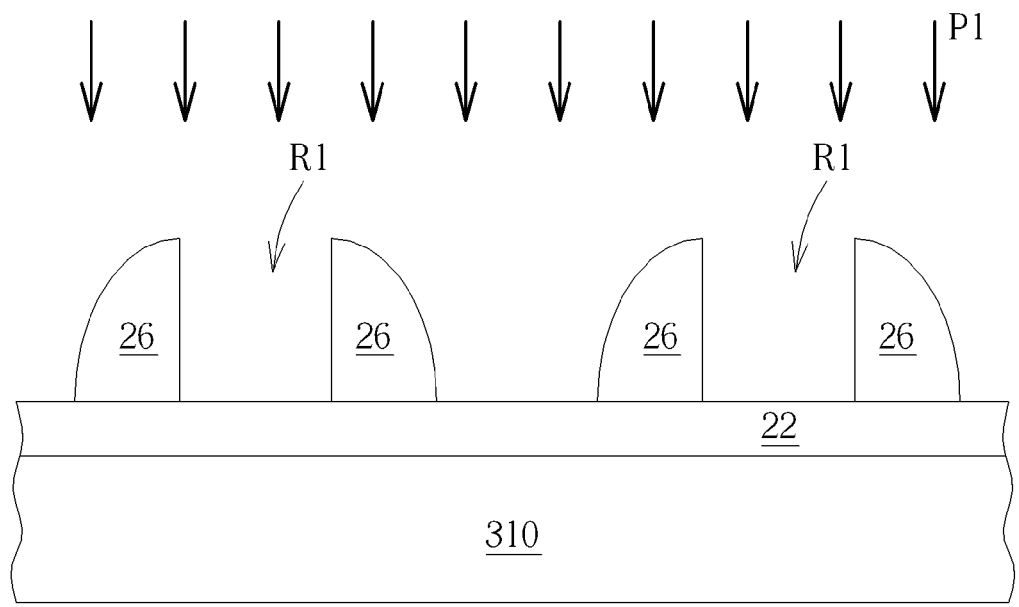

As shown in FIG. 9, the sacrificial pattern 24 is removed, so that recesses R1 are formed on the pad layer 22 in the spacers 26. The method of removing the sacrificial pattern 24 may be an etching process P1, wherein the etching rate of the etching process P1 to the sacrificial pattern 24 is larger than to the spacers 26, so that the sacrificial pattern 24 can being removed while most of the spacers 26 is kept intact.

Figure 10:
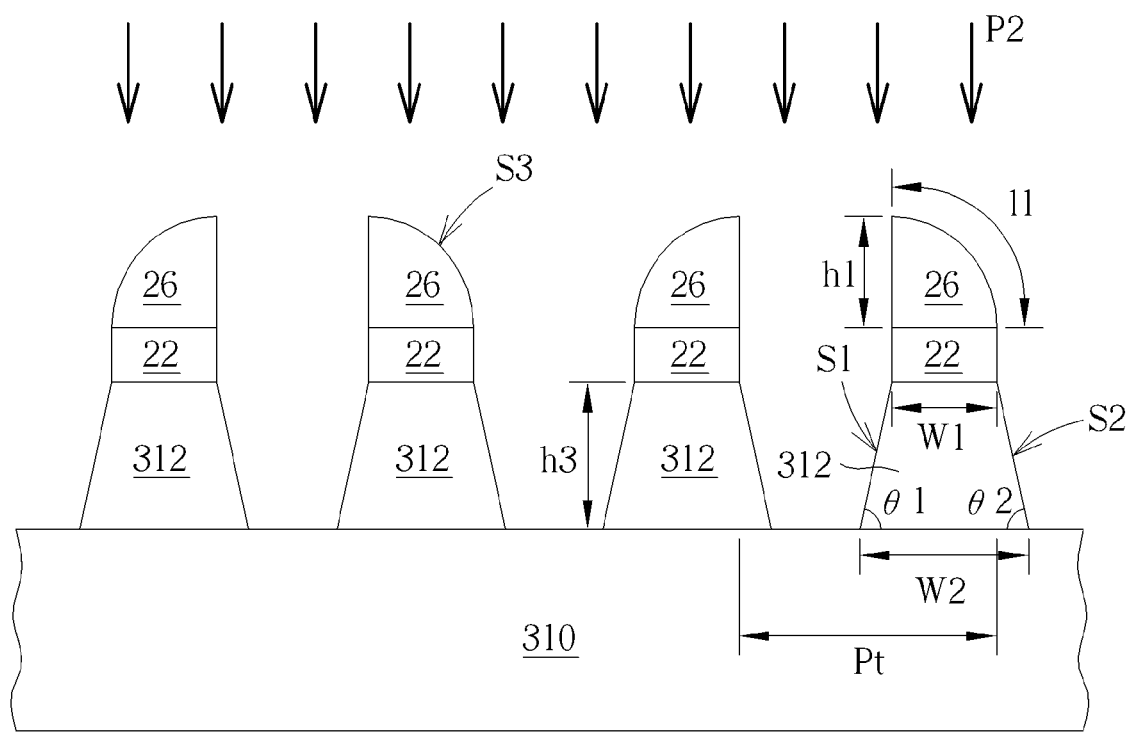

The layouts of the spacers 26 are transferred into the substrate 310, so that fin-shaped structures 312 are formed in the substrate 310 as shown in FIG. 10. In this embodiment, there are four fin-shaped structures 312; in another embodiment, the number of the fin-shaped structures 312 may be one or more than one. More precisely, the method of transferring the layout of the spacers 26 into the substrate 310 may be an etching process P2 using the spacers 26 as hard masks to etch the pad layer 22 and the substrate 310 downward, so that the fin-shaped structures 312 are formed. The etching process P2 may be a dry etching process, a wet etching process or the combination of both. In this embodiment, the etching process P2 is a fluoride-containing etching process, so that fluoride can accumulate on the sidewalls S1 and S2 of the fin-shaped structures 312 while etching, and the etching of the sidewalls S1 and S2 can therefore be restrained, thereby achieving fin-shaped structures 312 with oblique sidewalls; that is, the fin-shaped structures 312 have taper profiles. The materials of the sacrificial pattern 24, the pad layer 22, the spacer 26 and the substrate 310 and the etching processes P1 and P2 depend upon the sizes and the shapes etc. of the desired fin-shaped structures 312. Especially, the etching selectivities of the etching process P2 to the pad layer 22, the spacer 26 and the substrate 310 will dramatically affect the heights h3 and the shapes of the formed fin-shaped structures 312.

In this embodiment, the angles θ1 and θ2 between the sidewalls S1 and S2 of the fin-shaped structures 312 and the substrate 310 are less than 90 degree, so that the fin-shaped structures 312 have taper profiles. Preferably, the angles θ1 and θ2 between the sidewalls S1 and S2 of the fin-shaped structures 312 and the substrate 310 are of 70 degree, so that the fin-shaped structures 312 have taper profiles. Since the spacers 26 have a cambered surface S3, the angles θ1 and θ2 between the sidewalls S1 and S2 of the fin-shaped structures 312 and the substrate 310 can be different due to the boat-shaped profiles of the spacers 26, leading to different etching capabilities to the sidewalls S1 and S2 during the transfer of the layout of the spacers 26 into the substrate 310. Moreover, as the lengths l1 of the cambered surfaces S3 profiles of the spacers 26 are much shorter and the cross-sectional profiles of the spacers 26 are approximate rectangles, the angles θ1 and θ2 between the sidewalls S1 and S2 of the fin-shaped structures 312 and the substrate 310 are approximately the same. Therefore, the shapes of the fin-shaped structures 312 can be adjusted by adjusting the spacers 26.

It is emphasized that, the fin-shaped structures 312 in this embodiment can have shorter maximum width and shorter pitch Pt than the fin-shaped structures 212 in the second embodiment. The formed layout in this embodiment can therefore be refined, and the volume of the formed semiconductor component is reduced. More specifically, the maximum width w2 of the fin-shaped structures 312 in this embodiment (meaning the width of the bottoms of the fin-shaped structures 312) can approach the range of 5~20 nanometers. For example, the maximum width w2 of the fin-shaped structures 312 in this embodiment can be 10 nanometers. The pitch Pt between each of the fin-shaped structures 312 can approach 70 nanometers.

According to the above, the present invention provides a method for forming a fin-shaped structure, which transfers the layout of the spacer into the substrate to form at least a fin-shaped structure into the substrate, wherein the fin-shaped structure has a taper profile. More precisely, the method for forming a fin-shaped structure includes the following steps. A pad layer and a sacrificial pattern are sequentially formed on the pad layer. Spacers are formed on the pad layer beside the sacrificial pattern. The sacrificial pattern is removed. The layout of the spacers is transferred into the substrate, so that at least a fin-shaped structure having a taper profile is formed in the substrate. It is emphasized that, the ratio of the height of the spacer to the thickness of the pad layer is larger than 5, thereby forming the fin-shaped structure of the present invention. For instance, the maximum width of the fin-shaped structure can be comprised within 5~20 nanometers, such as 10 nanometers for example, and the pitch between each of the fin-shaped structures 312 can approach 70 nanometers.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a fin-shaped structure, comprising:
    forming a pad layer on a substrate;
    forming a sacrificial pattern on the pad layer;
    forming a spacer on the pad layer beside the sacrificial pattern, wherein the ratio of the height of the spacer to the pad layer is larger than 5;
    removing the sacrificial pattern completely; and
    transferring the layout of the spacer into the substrate after the sacrificial pattern is completely removed, to form at least a fin-shaped structure having a taper profile in the substrate.

2. The method for forming a fin-shaped structure according to claim 1, wherein the pad layer comprises an oxide layer.

3. The method for forming a fin-shaped structure according to claim 1, wherein the step for forming the sacrificial pattern comprises:
    entirely covering a sacrificial pattern material on the pad layer; and
    patterning the sacrificial pattern material to form the sacrificial pattern.

4. The method for forming a fin-shaped structure according to claim 1, wherein the sacrificial pattern comprises a polysilicon gate.

5. The method for forming a fin-shaped structure according to claim 1, wherein the step for forming the spacer comprises:
    entirely covering a spacer material on the sacrificial pattern and the pad layer; and
    etching the spacer material to form the spacer.

6. The method for forming a fin-shaped structure according to claim 1, wherein the pad layer comprises an oxide layer and the spacer comprises a nitride spacer.

7. The method for forming a fin-shaped structure according to claim 6, wherein the thickness of the pad layer is 100~110 angstroms and the thickness of the spacer is 800~900 angstroms.

8. The method for forming a fin-shaped structure according to claim 6, wherein removing the sacrificial pattern comprises performing an etching process, wherein the etching rate of the etching process to the sacrificial pattern is larger than to the spacer.

9. The method for forming a fin-shaped structure according to claim 1, wherein the method of transferring the layout of the spacer into the substrate comprises performing an etching process.

10. The method for forming a fin-shaped structure according to claim 9, wherein the etching process comprises a dry etching process, a wet etching process or the combination of both.

11. The method for forming a fin-shaped structure according to claim 9, wherein the etching process comprises a fluoride-containing etching process.

12. The method for forming a fin-shaped structure according to claim 1, wherein the angle between at least a sidewall of the fin-shaped structure and the substrate is less than 90 degree and thereby forming a fin-shaped structure having a taper profile.

13. The method for forming a fin-shaped structure according to claim 12, wherein the angle between at least a sidewall of the fin-shaped structure and the substrate is 70 degree thereby forming a fin-shaped structure having a taper profile.

14. The method for forming a fin-shaped structure according to claim 1, wherein the fin-shaped structure has two sidewalls, and the angles between the two sidewalls and the substrate are different.

15. The method for forming a fin-shaped structure according to claim 1, wherein the maximum width of the fin-shaped structure is comprised within a range of 5~20 nanometers.

16. The method for forming a fin-shaped structure according to claim 15, wherein the maximum width of the fin-shaped structure is 10 nanometers.

17. The method for forming a fin-shaped structure according to claim 1, wherein the pitch between each of the fin-shaped structures is 70 nanometers.

* * * * *